United States Patent
Wang et al.

(10) Patent No.: US 8,730,070 B2
(45) Date of Patent: May 20, 2014

(54) DECODING METHOD AND DECODER FOR UNARY/K$^{th}$ ORDER EXPONENTIAL GOLOMB CODES

(71) Applicant: MStar Semiconductor, Inc., Hsinchu Hsien (TW)

(72) Inventors: Yao-Hsin Wang, Hsinchu County (TW); Yu-Chao Lin, Hsinchu County (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/914,765

(22) Filed: Jun. 11, 2013

(65) Prior Publication Data

US 2013/0328705 A1    Dec. 12, 2013

Related U.S. Application Data

(60) Provisional application No. 61/658,398, filed on Jun. 11, 2012.

(51) Int. Cl.
  *H03M 7/00*    (2006.01)
(52) U.S. Cl.
  USPC ............................... 341/106; 341/107

(58) Field of Classification Search
  CPC ....... H03M 7/30; H03M 7/40; H03M 7/4006; H04N 7/50; H04L 25/03038
  USPC ................. 341/106, 107, 51, 65, 67
  See application file for complete search history.

(56) References Cited

U.S. PATENT DOCUMENTS

| | | | |
|---|---|---|---|
| 6,982,663 B2 | 1/2006 | Winger | |
| 2009/0168868 A1* | 7/2009 | Jahanghir | ................ 375/240.02 |

* cited by examiner

*Primary Examiner* — Joseph Lauture
(74) *Attorney, Agent, or Firm* — WPAT, PC; Justin King

(57) ABSTRACT

A decoding method for unary/k$^{th}$ order exponential Golomb (UEGk) codes is provided. The first step is a receiving step: receiving N bits from an input stream and updating a bit count. If the N bits are all one, the receiving step is re-performed. If the N bits includes zero, a searching step is performed to find a first value based on the bit count. Subsequently, according to the bit count and a threshold value, a remaining bit number M is calculated. A second value is generated based on M remaining bits received from the input stream. Then, the first value and the second value are added, so as to generate an index.

12 Claims, 10 Drawing Sheets

| Index | A | B | C |
|---|---|---|---|
| 0 | 0 | | |
| 1 | 10 | | |
| 2 | 110 | | |
| 3 | 1110 | | |
| 4 | 1111 | 0 | 0 |
| 5 | 1111 | 0 | 1 |
| 6 | 1111 | 10 | 00 |
| 7 | 1111 | 10 | 01 |
| 8 | 1111 | 10 | 10 |
| 9 | 1111 | 10 | 11 |
| 10 | 1111 | 110 | 000 |
| 11 | 1111 | 110 | 001 |

FIG. 1(Prior Art)

| P | First value |
|---|---|
| 1 | 0 |
| 2 | 1 |
| 3 | 2 |
| 4 | 3 |
| 5 | 4 |
| 6 | 6 |
| 7 | 10 |
| 8 | 18 |
| 9 | 34 |
| 10 | 66 |
| 11 | 130 |
| 12 | 258 |
| ⋮ | ⋮ |

FIG. 3

| P | Three bits last received | First value |
|---|---|---|
| 3 | 0XX | 0 |
|   | 10X | 1 |
|   | 110 | 2 |
| 6 | 0XX | 3 |
|   | 10X | 4 |
|   | 110 | 6 |
| 9 | 0XX | 10 |
|   | 10X | 18 |
|   | 110 | 34 |
| 12 | 0XX | 66 |
|   | 10X | 130 |
|   | 110 | 258 |
| ⋮ | ⋮ | ⋮ |

FIG. 5

| P | First value |
|---|---|
| 3 | 0 |
| 6 | 3 |
| 9 | 10 |
| 12 | 66 |
| ⋮ | ⋮ |

FIG. 6A

| P | First value |
|---|---|
| 3 | 1 |
| 6 | 4 |
| 9 | 18 |
| 12 | 130 |
| ⋮ | ⋮ |

FIG. 6B

| P | First value |
|---|---|
| 3 | 2 |
| 6 | 6 |
| 9 | 34 |
| 12 | 258 |
| ⋮ | ⋮ |

FIG. 6C

| P | Three bits last received | First value |
|---|---|---|
| 7 | 0XX | 4 |
| | 10X | 6 |
| | 110 | 10 |
| 10 | 0XX | 18 |
| | 10X | 34 |
| | 110 | 66 |
| 14 | 0XX | 130 |
| | 10X | 258 |
| | 110 | 514 |
| ⋮ | ⋮ | ⋮ |

DECODING METHOD AND DECODER FOR UNARY/$K^{th}$ ORDER EXPONENTIAL GOLOMB CODES

This application claims the benefit of U.S. provisional application Ser. No. 61/658,398, filed Jun. 11, 2012, the subject matter of which is incorporated herein by reference.

BACKGROUND OF THE INVENTION

1. Field of the Invention

The invention relates in general to a decoding technique, and more particularly to a decoding technique for unary/$k^{th}$ order exponential Golomb (UEGk) codes.

2. Description of the Related Art

Unary/$k^{th}$ order exponential Golomb (UEGk) codes, featuring advantages of both a high compression rate of unary coding and a shorter length of $k^{th}$ order exponential Golomb coding, is prevalent in various video specifications including H.264, MPEG-4, and AVC.

The U.S. Pat. No. 6,982,663 discloses details of an encoding method for UEGk codes. A UEGk decoder converts a series of consecutively received 0/1 bitstreams into multiple indices or codewords. A UEGk code corresponding to each index may include three parts—a part A, a part B, and a part C, or may only include a part A in unary coding. A maximum length of the unary-coded part A is variable, and the length difference of parts B and C are correlated to a "k" value which is an integer. These two values (maximum length of part A and k value) are predetermined by the decoder.

FIG. 1 shows an example of a table listing contents of a UEGk code having indices 0 to 11 respectively corresponding to parts A, B, and C. In the example, the maximum length of the part A is four bits, and bit counts of the parts B and C are the same, indicating that one-order (k=1) exponential Golomb coding is adopted. In practice, the decoder may determine a range of the part A according to the known maximum length of the part A, and determine where the part A or the part B ends according to a position of a first bit "0". Taking FIG. 1 for example, when the input sequence is {1 1 1 1 1 1 0 0 0 1 1 1 . . . }, as the first four bits do not include "0", the decoder may first determine that the first four bits in the input sequence are the part A of the index to be decoded. According to the position of the first bit "0" (the seventh bit in the input sequence), the decoder may identify the end of the part B to further determine that the part B is "110" and has a length of 3 bits. In this example, the lengths of the parts B and C are the same, and thus the decoder may determine that the part C are the three following bits "001". In conclusion from the above information, the UEGk code corresponding to the index to be decoded is the first ten bits (1111110001) in the input sequence, and the subsequent bits correspond to the next index.

In the U.S. Pat. No. 6,982,663, the disclosed decoding method respectively identifies a part A, a part B, and a part C of an index, and adds values representing the three parts. Taking the above UEGk code "1111110001" for example, in the prior art, it is calculated that the value representing the part A is equal to 4 (=1+1+1+1), the value representing the part B is equal to 6 (=$2^1+2^2$), and the value representing the part C is equal to 1 (=$2^0$). The three values 4, 6, and 1 are added to obtain the index value as 11. However, such an approach suffers from certain setbacks. For example, the computation amount of the part B increases as the length of the part B increases ($2^1+2^2+\ldots+2^N$), leading to increased calculation complications and thus reduced processing performance or even exceeding a system tolerable clock occurs. In general, in high-end manufacturing processes, an increased processing clock may be feasible to prevent the above issue with the sacrifice of increased power consumption and costs. Therefore, there is a need for a solution for eliminating the above setbacks.

SUMMARY OF THE INVENTION

The invention is directed to a decoding method and a decoder for unary/$k^{th}$ order exponential Golomb (UEGk) codes. Instead of respectively determining values corresponding to a part A, a part B, and a part C in a UEGk code, in the decoding method and the decoder disclosed by the present invention, values corresponding to the part B and the part C are simultaneously determined through a look-up operation, and the determined values are added with a value corresponding to the part C.

According to an embodiment of the present invention, a decoding method for a UEGk code is provided. The decoding method comprises the following steps. An N number of bits are received from an input bitstream, and a bit count is updated according to N, where N is a positive integer. When all of the N number of bits are "1", a look-up operation is performed according to the bit count to generate a first value, eliminating calculation requirements. A remaining bit count M is determined according to the bit count and a threshold. A second value is generated according to an M number of remaining bits received from the input bitstream. The first value and the second value are added to generate an index.

According to another embodiment of the present invention, a decoder for a UEGk code is provided. The decoder comprises a reception module, a counter module, a bit zero detection module, a memory module, a look-up module, a remaining bit determination module, and a calculation module. The reception module receives an input bitstream, and outputs an N number of bits each time, where N is a positive integer. Each time the reception module outputs the N number of bits, the counter module updates a bit count according to the positive integer N. The bit zero detection module detects whether the N number of bits last output by the reception module are "0" or "1". The memory module stores a look-up table. When the bit zero detection module determines that not all of the N number of bits output by the reception module are "1", the look-up module searches through the look-up table to generate a first value. The remaining bit determination module determines a remaining bit count M according to the bit count and a threshold, and generates a second value according to an M number of remaining bits of the input bitstream. The calculation module adds the first value and the second value to generate an index.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 1 is an example of a table listing contents of a UEGk code having indices 0 to 11 respectively corresponding to parts A, B, and C.

FIG. 3 is an exemplary look-up table according to an embodiment of the present invention.

FIG. 5 and FIGS. 6A to 6C are two other exemplary look-up tables according to embodiments of the present invention.

DETAILED DESCRIPTION OF THE INVENTION

Figure 2:
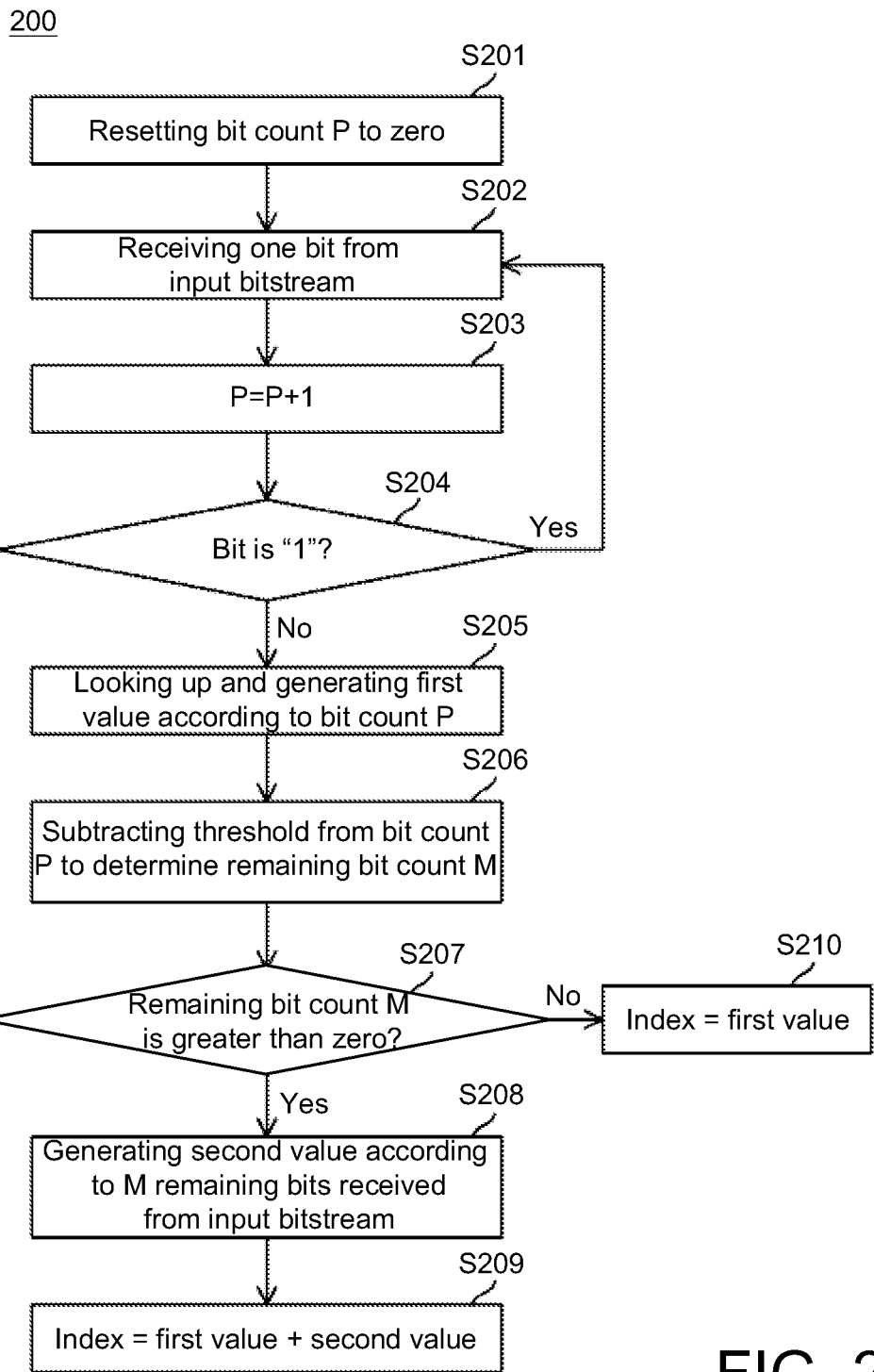
FIG. 2 is a flowchart of a decoding method according to an embodiment of the present invention.

According to an embodiment of the present invention, a decoding method is provided. FIG. 2 shows a flowchart of the decoding method, which comprises the following steps each time a new index is to be identified. In step S201, a bit count P is reset, e.g., to zero. In step S202, one bit is received from an input bitstream. In step S203, the bit count P is incremented by 1. In step S204, it is determined whether the bit received in step S202 is "1". Steps S202 to S204 are repeated when a determination result of step S204 is yes, or else step S205 is performed when the determination result of step S204 is no. In step S205, a look-up operation is performed according to the bit count P to generate a first value. FIG. 3 shows an exemplary look-up table applicable to the embodiment. In step S206, a threshold is subtracted from the bit count P to determine a remaining bit count. In the embodiment, the threshold is set as a maximum length of part A. In step S207, it is determined whether the remaining bit count M is greater than zero. Step S208 is performed when a determination result of step S207 is yes (i.e., MA) to generate a second value according to an M number of remaining bits received from the input bitstream. In step S209, the first value generated in step S205 and the second value generated in step S208 are added to generate the index. Conversely, step S210 is performed when the determination result of step S207 is no (i.e., M=0) to render the index to equal to the first value.

An exemplary input bitstream {1 1 1 1 1 1 1 0 1 0 0 0 1 1 ...} is utilized for illustrating the decoding process 200. Since the first seven bits of the input bitstream are all "1", steps S202 to S204 are repeatedly performed eight times, and step S205 is only performed for the first time when the eighth bit "0" is received while the bit count P is accumulated to 8. According to the look-up table in FIG. 3, the bit count P in a value of 8 corresponds to a first value of 18. The bit count P accumulated to a value of 8 indicates that the part A and the part B of the current UEGk code have a total length of eight bits. When the maximum length of the part A is four bits, and the lengths of the part B and part C are equal (k=1), the threshold utilized in step S206 is the maximum length of the part A. In step S206, the remaining bit count M corresponding to the part C is calculated as equal to 4 (=8–4). Thus, in step S208, according to the four bits corresponding to the part C, i.e., the ninth to the twelfth bits (1000) in the input bitstream, it is determined that the binary bit code "1000" is a decimal value of 8 to obtain the second value equal to 8. In step S209, the first value of 18 and the second value of 8 are added to generate an index of 26.

In the above UEGk decoding example, it is assumed that the maximum length of the part A is four bits, and the bit counts of the part B and C are equal. It can be easily be appreciated by a person having ordinary skill in the art that the present invention is not limited to the above exemplary assumption. For example, the threshold may be correspondingly adjusted to 5 if the maximum length of the part A is five bits. Alternatively, when the lengths of the parts B and C are different, the threshold may be correspondingly changed according to a difference in the lengths (i.e., the value k) such that the remaining bit count M calculated in step S206 is equal to the length of the part C. In other words, the threshold is associated with the length of the part A and a length difference between the parts B and C, the bit count P is associated with bit lengths of the parts A and B, and the remaining bit count M is associated with the bit length of the part C. Based on the above settings, instead of the example in FIG. 2, details for establishing the look-up table, looking up the first value, determining the bit length of the part C and generating the second value can be appropriately modified.

It is demonstrated in the above descriptions that, rather than individually determining the respective values corresponding to the part A, the part B, and the part C in a UEGk code as in the prior art, in the decoding process 200, the value (i.e., the first value) corresponding to the part A and the part B of the UEGk code is simultaneously determined, which is different from individually determining the respective values corresponding to the part A and the part B through counting. In the decoding process 200, the first value is then added to the second value corresponding to the part C. Thus, in the present invention, by looking up the first value through the bit count P, the issue of significantly increased calculation complications resulted by a long length of the part B can be eliminated. It should be noted that, when the remaining bit count M is smaller than zero, it means that the current UEGk code comprises only the part A, but not the parts B and C. Thus, the first value generated in step S205 is determined as the index of the UEGk code in step S210.

Figure 4:
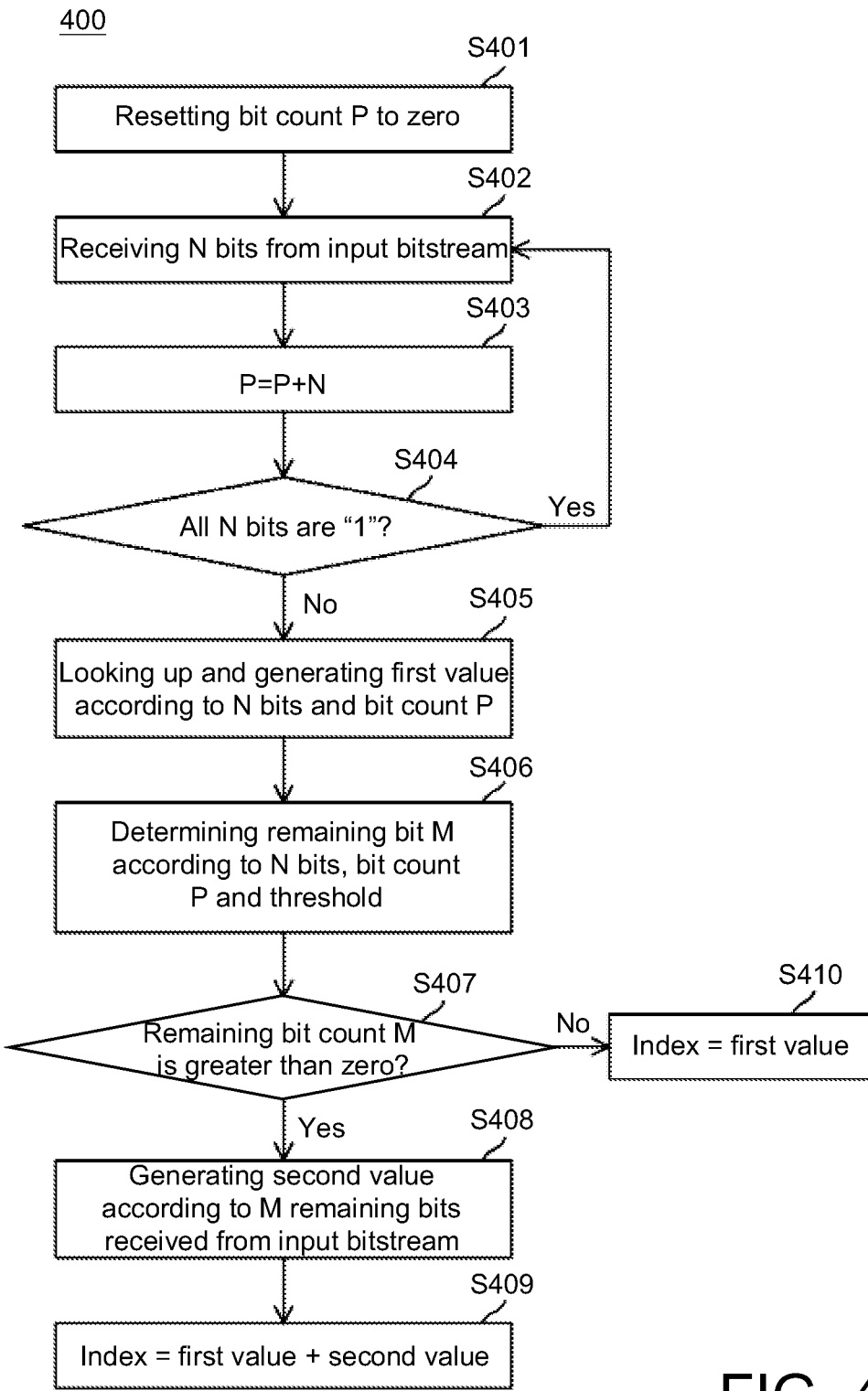
FIG. 4 is a flowchart of a decoding method according to another embodiment of the present invention.

FIG. 4 shows a flowchart of a decoding method according to another embodiment of the present invention. In the embodiment, the method comprises the following steps each time a new index is to be identified. In step S401, a bit count P is reset, e.g., to zero. In step S402, an N number of bits are received from an input bitstream, where N is an integer greater than 1 (e.g., 2, 3, 4 ...). In step S403, the bit count P is added by N. In step S404, it is determined whether all of the N number of bits received in step S402 are "1". Steps S402 to S404 are repeated when a determination result of step S404 is yes, or else step S405 is performed when the determination result of step S404 is no. In step S405, a look-up operation is performed to generate a first value according to the N number of bits and the bit count P. FIG. 5 shows an exemplary look-up table applicable to the embodiment, with details thereof to be described shortly. In step S406, a remaining bit count M is determined according to the N number of bits, the bit count P and a threshold. In step S407, it is determined whether the remaining bit count M is greater than zero. Step S408 is performed when a determination result of step S407 is yes to generate a second value according to an M number of remaining bits. In step S409, the first value generated in step S405 and the second value generated in step S408 are added to generate the index. Conversely, step S410 is performed when the determination result of step S407 is no to render the index as the first value.

An exemplary input bitstream {1 1 1 1 1 1 1 0 1 0 0 0 1 1 ...} and setting N equal to 3 are utilized for illustrating the decoding process 400. Since the first seven bits of the input bitstream are all "1", steps S402 to S404 are repeatedly performed three times, and step S405 is only performed for the first time when three bits "101" are received in step S402 and the bit count P is accumulated to 9. In the look-up table in FIG. 5, an index column in the middle shows the three bits last received, wherein a symbol X represents a wildcard, or "don't care". This indication of a wild card represents any bit of either 0 or 1. According to the look-up table in FIG. 5, the bit count P is equal to 9 and in the three bits last received are "101", so a first value corresponds to 18. The bit count P accumulated to 9 indicates that the part A and the part B of the current UEGk code have a total length of between seven and nine bits. Assuming that the maximum length of the part A is four bits, and the lengths of the part B and part C are equal, the threshold utilized in step S406 is the maximum length of the part A. According to the three bits "101" last received in step S406, it is learned that the part B ends at the eighth bit instead of the ninth bit of the input bitstream, and the last bit "1" in the three bits "101" belongs to the part C. In step S406, the remaining bit count M corresponding to the part C is calculated to equal to 4 (=9−1−4). Thus, in step S408, accord to the four bits "1000" corresponding to the part C, it is determined that the part C of the UEGk code corresponds to a value of 8. In step S409, the first value of 18 and the second value of 8 are added to generate an index of 26.

When the remaining bit count M is smaller than or equal to zero, it means that the current UEGk code comprises only the part A, but not the parts B and C. Thus, the first value generated in step S405 is determined as the index of the UEGk code in step S410. Similarly to the example in FIG. 2, it should be noted that, in this embodiment, the example of the part A having a maximum length of four bits and bit counts of the parts B and C being equal is described for illustration purposes rather than a limitation to the present invention. Further, the integer N may also be a value other than 3.

In another embodiment, the look-up table in FIG. 5 may be divided, e.g., into three look-up tables in FIGS. 6A to 6C. FIG. 6A shows a situation of a look-up table corresponding to three bits "0XX"; FIG. 6B shows a situation of a look-up table corresponding to three bits "10X"; FIG. 6C shows a situation of a look-up table corresponding to three bits "110". Step S405 may comprise two sub-steps: 1) selecting a target look-up table from an N number of look-up tables according to an N number of bits last received; and 2) searching through the target look-up table according to the bit count P to generate the first value.

It should be noted that, the look-up tables in FIGS. 3, 5, and 6A to 6C are generated according to settings (e.g., the maximum length of the part A, the value k and the value N) of a UEGk code.

Figure 7:
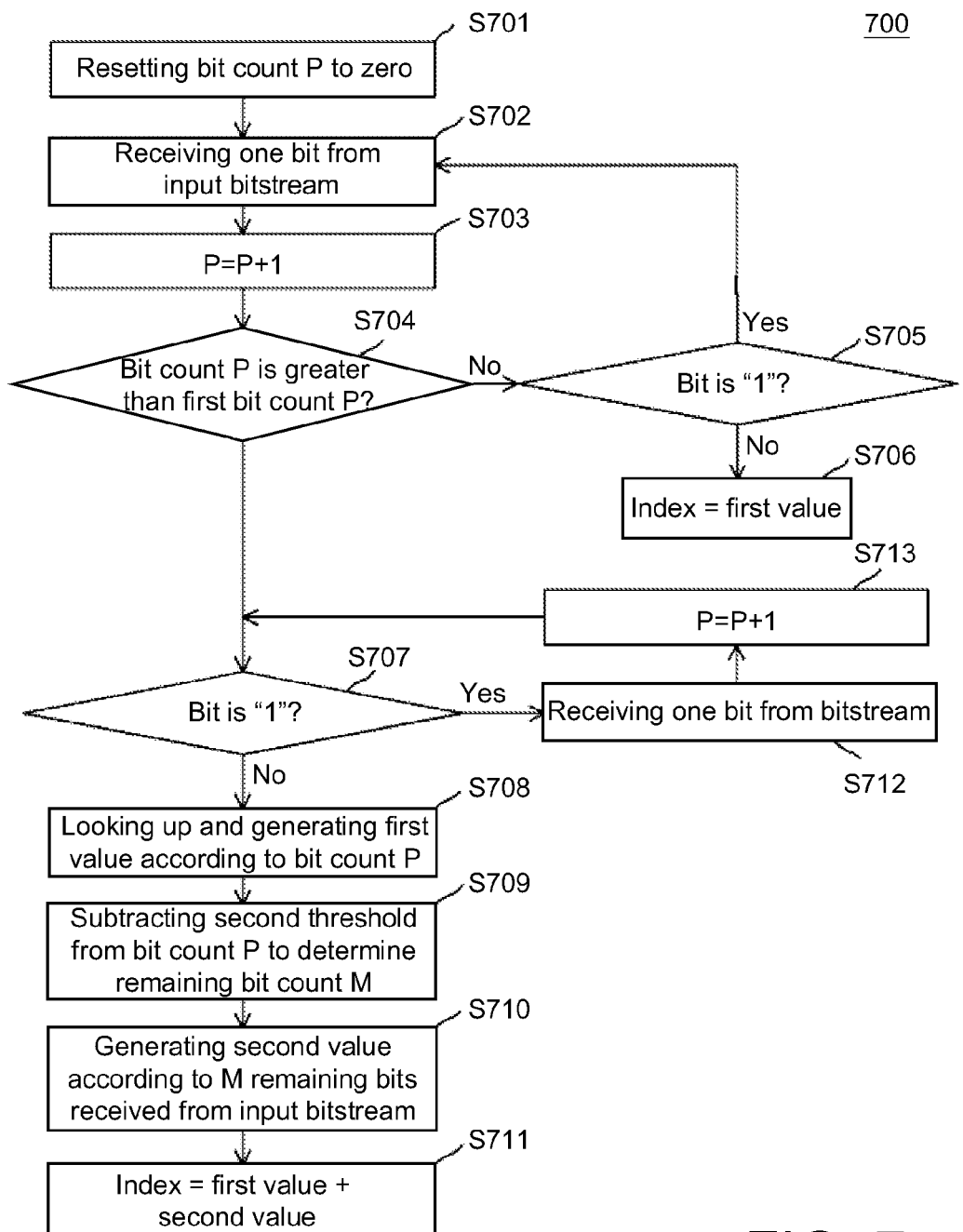
FIG. 7 is a flowchart of a decoding method according to another embodiment of the present invention.

FIG. 7 shows a flowchart of a decoding method according to another embodiment of the present invention. In the embodiment, the method comprises the following steps each time a new index is to be identified. In step S701, a bit count P is reset, e.g., to zero. In step S702, one bit is received from an input bitstream. In step S703, the bit count P is incremented by 1. In step S704, it is determined whether the bit count P is greater than a first threshold, i.e., the first bit count P indicating the maximum length of the part A. Step S705 is performed when a determination result of step S704 is no to determine whether the bit is "1". Steps S702 to S704 are repeated when a determination result of step S705 is yes. Conversely, step S706 is performed when the determination result of step S705 is no to render the index to equal to the bit count P decremented by 1.

When the determination result of step S704 is yes, steps S707 to S713 are performed. In step S707, it is determined whether the currently received bit is "1". Steps S712 and S713 are performed when a determination result of step S707 is yes to increment the bit count P by 1 after receiving one bit from the input bitstream, followed by again performing step S707.

Only when the determination result of step S707 is no, steps S708 to S711 are performed. In step S708, a look-up operation is performed to generate a first value according to the bit count P. The look-up table shown in FIG. 3 is applicable to the embodiment. In step S709, the bit count P is subtracted by a second threshold to determine a remaining bit count M. In step S710, a second value is generated according to an M number of remaining bits. In step S711, the first value and the second value are added to generate the index.

In the above embodiment, the first threshold and the second threshold are the maximum length of the part A of the UEGk code to be decoded. When a sequence of the currently input bit is smaller than or equal to the first threshold (indicating that the UEGk code to be decoded comprises only the part A), the process is handled by a front-end sub-procedure formed by steps S702 to S706. Once the sequence of the input bit is greater than the first threshold (indicating that the UEGk code to be decoded comprises the parts A, B, and C), the process is then handled by a back-end sub-procedure formed by step S707 to S713. Taking the first threshold and the second threshold both equal to 4 for example, when the index corresponding to the current UEGk code to be decoded falls between 0 and 3, the index value is generated by step S706. Conversely, when the index corresponding to the current UEGk code to be decoded is greater than 3, the index is generated by step S711. In practice, with the look-up tables of the embodiment, the contents in the columns 1 to 4 corresponding to P in the look-up table in FIG. 3 can be omitted.

An example of the first threshold and the second threshold both equal to 4 is given for describing the decoding process 700. Step S705 is repeatedly performed four times, until steps S702 to S704 are performed for the fifth time and the determination result of step S704 is yes. At this point, the bit count P is equal to 5, and is greater than the first threshold. Steps S707, S712, and S713 are then repeatedly performed three times, until the eighth bit in the input bitstream is received and the determination result of step S707 is no. At this point, the bit count P is equal to 8. According to the look-up table in FIG. 3, the bit count P in a value of 8 corresponds to a first value of 18. The bit count P accumulated to a value of 8 indicates that the part A and the part B of the current UEGk code have a total length of eight bits. It is assumed that the lengths of the part B and part C are equal. In step S709, the remaining bit count M corresponding to the part C is calculated to equal to 4 (=8−4). Thus, in step S710, according to the four bits corresponding to the part C, i.e., the ninth to the twelfth bits (1000) in the bitstream, it is determined that the binary bit code "1000" is a decimal value of 8 to obtain the second value of 8. In step S711, the first value of 18 and the second value of 8 are added to generate an index of 26.

Figure 8:
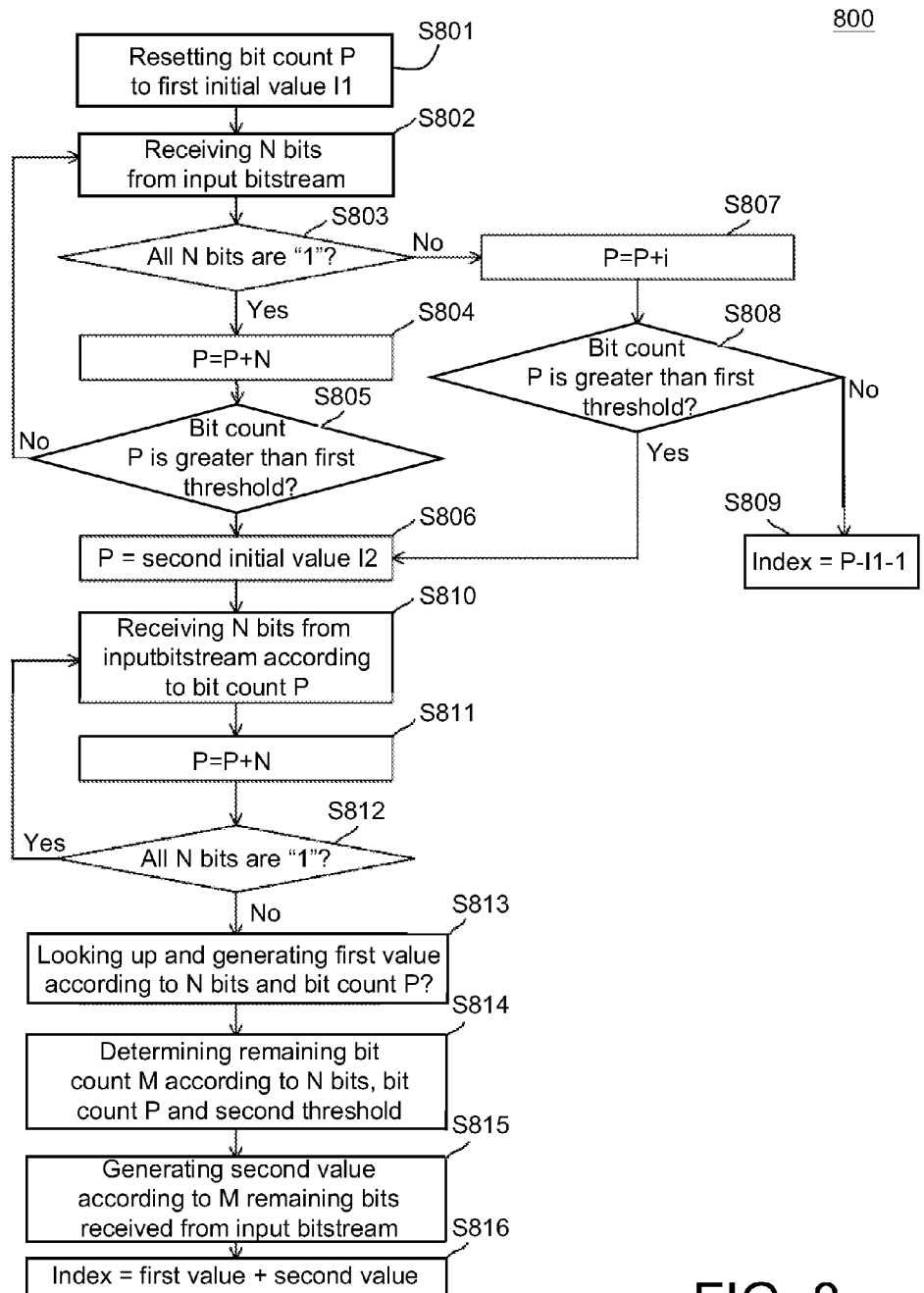
FIG. 8 is a flowchart of a decoding method according to another embodiment of the present invention.

FIG. 8 shows a flowchart of a decoding method according to another embodiment of the present invention. In the embodiment, the method comprises the following steps each time a new index is to be identified. In step S801, a bit count P is reset to a first initial value $I_1$. In step S802, an N number of bits are received from an input bitstream, where N is an integer greater than 1. In step S803, it is determined whether all of the N bits are "1". Step S804 is performed when a determination result of step S803 is yes to increment the bit count P by N. In step S805, it is determined whether the bit count P is greater than a first threshold. On the other hand, when the determination result of step S803 is no and a bit "0" first appears in the N bits is an $i^{th}$ bit, where i is an integral index between 1 and N, step S807 is performed to increment the bit count P by i. In step S808, it is determined whether the bit count P is greater than the first threshold, which is usually set as a maximum length of the part A added with the first initial value $I_1$. When a determination result of step S808 is no, the index is set to equal $[P-I_1-1]$ in step S809.

Figures 9, 10:
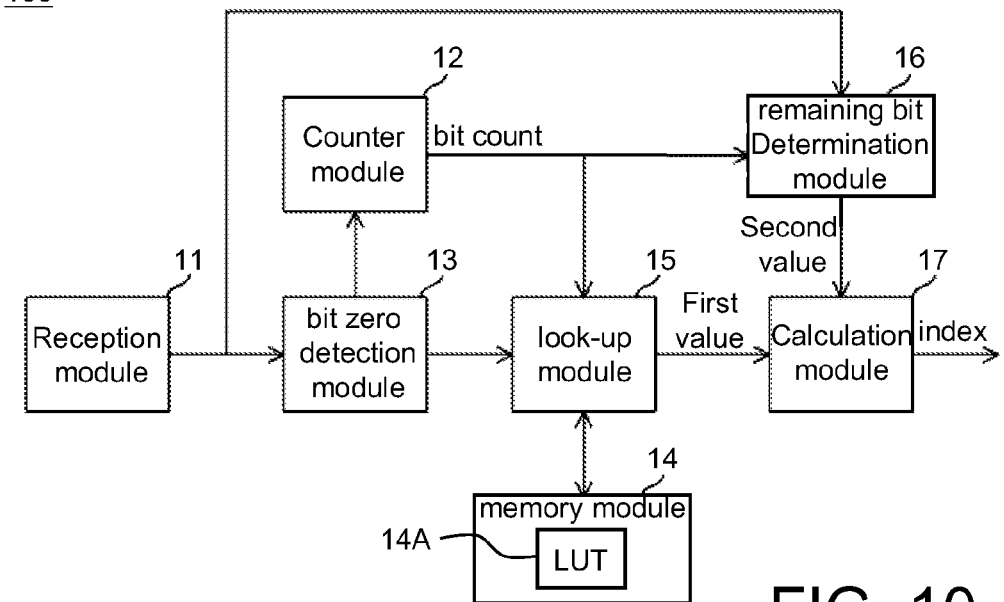
FIG. 9 is an exemplary look-up table according to an embodiment of the present invention.
FIG. 10 is a functional block diagram of a decoder according to an embodiment of the present invention.

When the determination result of step S805 or S808 is yes, step S806 is performed to set the bit count P to a second initial value $I_2$, which is usually set as the maximum length of the part A. In step S810, N bits are received from the input bitstream. In step S811, the bit count P is incremented by N. In step S812, it is determined whether all of the N bits are "1". Steps S810 to S812 are repeatedly performed when a determination result of step S812 is yes, or else step S813 is performed when the determination result of step S812 is no. In step S813, a look-up operation is performed to generate a first value. FIG. 9 shows an exemplary look-up table applicable to the embodiment. The look-up table in FIG. 9 establishes a relationship among the bit count P, the last N bits and the first value. In step S814, a remaining bit count M is determined according to the N bits, the bit count P, and a second threshold, wherein the second threshold added with the second initial value $I_2$ is similarly set as the maximum length of the part A. In step S815, a second value is generated according to an M number of remaining bits. In step S816, the first value generated in step S813 and the second value generated in step S815 are added to generate the index.

Similarly, in the above embodiment, when a sequence of the currently input bit is smaller than or equal to the first threshold (indicating that the UEGk code to be decoded comprises only the part A), the process is handled by a front-end sub-procedure formed by steps S802 to S809. Once the sequence of the input bit is greater than the first threshold (indicating that the UEGk code to be decoded comprises the parts A, B, and C), the process is then handled by a back-end sub-procedure formed by step S810 to S816. Taking the first threshold and the second threshold both equal to 4 for example, when the index corresponding to the current UEGk code to be decoded falls between 0 and 3, the index value is generated by step S809. Conversely, when the index corresponding to the UEGk code to be decoded is greater than 3, the index is generated by step S816. In practice, the look-up table in FIG. 9 may also be divided into three sub-look-up tables corresponding to three different bit situations.

An example of the maximum length of the part A equal to 4, the first threshold and the second threshold both equal to 4, the first initial value $I_1$ equal to 0, the second initial value $I_2$ equal to 4, and the N number bits received equal to 3 is given for describing the decoding process 800. When the input bitstream is {1 1 1 0 1 1 . . . }, three bits received when step S802 is performed for the first time are "111", and so a first determination result of step S803 is yes. As a bit count P is equal to 3, a first determination result of step S805 is no. The three bits received when step S802 is performed for the second time are "011", and so a second determination result of step S803 is no. Next, since "0" appears as the first bit in "011", the bit count P is set as 4 in step S807, such that a determination result of step S808 is no. In step S809, the index is set as 3 (=4−0−1).

When the input bitstream is {1 1 1 1 1 1 0 1 0 0 0 1 1 . . . }, steps S802 to S805 are repeatedly performed twice. After performing step S802 for the second time, the bit count P is equal to 6, and so the determination result of step S805 is yes. In step S806, the bit count P is reset as the second initial value 4. It should be noted that, when step S801 is performed for the first time, three bits are next received starting from the fifth bit in the input bitstream since the maximum length of the part is equal to 4, i.e., the fifth to seventh bits in the input bitstream are received. Thus, a first determination result of step S812 is yes, such that step S810 is again performed. The three bits received when step S810 is performed for the second time are "010", such that the bit count P changes to 10 and the determination result when step S810 is performed for the second time is no. According to the look-up table in FIG. 9, the bit count P is 10, and contents of the three bits last received correspond to a first value of 18. Thus, in step S813, it is identified that the first value is 18. In step S814, the bit count P accumulated to a value of 10 indicates that a total length of the part A and the part B is between eight and ten bits. It is assumed that the parts B and C are equal in length. According to the three bits "010" last received, it is inferred that the part B ends at the eighth bit of the input bitstream. Accordingly, the bit count P is adjusted to 8, and it is calculated that the bit count M respectively corresponding to the part B and part C is equal to 4 (=8−4). In step S815, it is determined that the part C of the UEGk code corresponds to a value of 8 according to the four bits "1000" corresponding to the part C. In step S816, the first value of 18 and the second value of 8 are added to generate an index of 26.

When the input bitstream is {1 1 1 1 0 0 1 1 . . . }, the determination result of step S803 performed for the second time is no. At this point, the bit count P is equal to 3. In step S807, since the bit "0" in the three bits "100" last received appears for the first time as the second bit (i=2) of the three bits "100", the bit count P is set as 5 (=3+2). Thus, the determination result of step S808 is yes, such that the bit count P is reset to the second initial value of 4 in step S806. As previously described, when step S810 is performed for the first time, as the maximum length of the part A is equal to 4, three bits are next received starting from the fifth bit of the input bitstream, i.e., the fifth to seventh bits "001" in the input bitstream are received. In step S811, the bit count P is set to 7. Step S813 is performed since the determination result of step S812 is no. According to the look-up table in FIG. 9, the bit count P equal to 7 and the contents of the three bits "001" last received correspond to a first value of 4. Therefore, in step S813, it is identified that the first value is 4. In step S814, assuming that the part B and part C are equal in length, it is inferred that the part B ends at the fifth bit of the input bitstream according to the three bits "001" last received. Accordingly, the bit count P is adjusted to 5, and the bit count M respectively corresponding to the part B and the part C is calculated to equal to 1 (=5−4). In step S815, it is determined that the part C of the UEGk code corresponds to a value of 0 according to a unary bit corresponding to the part C. In step S816, the first value of 4 and the second value of 0 are added to generate an index of 4.

A UEGk decoder is provided according to an embodiment of the present invention. FIG. 10 shows a functional block diagram of the UEGk decoder. Referring to FIG. 10, a UEGk decoder 100 comprises a reception module 11, a counter module 12, a bit zero detection module 13, a memory module 14, a look-up module 15, a remaining bit determination module 16, and a calculation module 17. In practice, the decoder 100 may be utilized to perform the abovementioned decoding process 200 or the decoding process 400 in FIG. 4, with associated details to be described below.

When the decoder 100 is utilized to perform the decoding process 200, the reception module 11 receives an input bitstream. Each time when the bit zero detection unit 13 receives one bit, the counter module 12 updates a bit count (e.g., increments the bit count by 1). The bit zero detection module 13 detects whether the bit last received from the reception module 11 is "0" or "1". The memory module 14 stores a look-up table 14A. Contents of the look-up table 14A are associated with the bit count and a first value. When the bit zero detection module 13 detects that the bit last received is "0", the look-up module 15 searches the look-up table 14A according to the bit count to generate a first value. The remaining bit determination module 16 determines a remaining bit count M according to the bit count and a threshold. When the remaining bit count M is greater than zero, the remaining bit determination module 16 correspondingly receives an M number of remaining bits in the input bitstream from the reception module 11 to generate a second value. When the remaining bit count M is smaller than or equal to zero, the remaining bit determination module 16 renders the second value to be equal to zero. The calculation module 17 adds the first value and the second value to generate an index. It can be easily appreciated by a person having ordinary skill in the art that, details of the decoding process 200 in the abovementioned can be applied to the decoder 100 and shall be omitted herein.

Further, when the decoder 100 is utilized to perform the decoding process 400, the reception module 11 receives an input bitstream. Each time when the bit zero detection unit 13 receives an N bits from the input bitstream (where N is an integer greater than 1), the counter module 12 updates a bit count (e.g., incrementing the bit count by N). In the situation, the bit zero detection module 13 detects whether the N bits last received are "0" or "1". The look-up table 14A stored in the memory module 14 is associated with the bit count, the N number of bits last received and a first value. When the bit zero determination module 13 determines that not all of the N bits are "1", the look-up module 15 searches the look-up table 14A according to the N bits and the bit count to generate the first value. The remaining bit determination module 16 determines a remaining bit count M according to the N bits, the bit count and a threshold. When the remaining bit count M is greater than zero, the remaining bit determination module 16 generates a second value according to an M number of remaining bits. When the remaining bit count M is smaller than or equal to zero, the remaining bit determination module 16 renders the second value to equal to zero. Similarly, the calculation module 17 adds the first value and the second value to generate an index. It can be easily appreciated by a person having ordinary skill in the art that, details (e.g., three sub-look-up tables) of the decoding process 400 in the abovementioned can be applied to the decoder 100 and shall be omitted herein for the sake of brevity.

Figure 11:
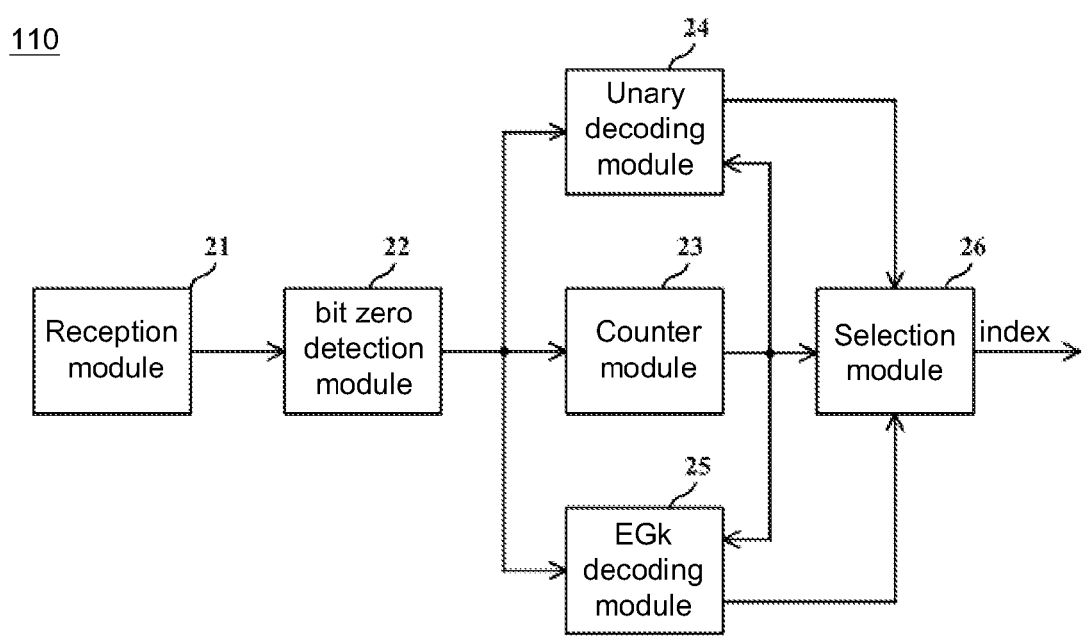
FIG. 11 is a functional block diagram of a decoder according to another embodiment of the present invention.

A UEGk decoder is provided according to an embodiment of the present invention. FIG. 11 shows a functional block diagram of the UEGk decoder. Referring to FIG. 11, a UEGk decoder 110 comprises a reception module 21, a bit zero detection module 22, a counter module 23, a unary decoding module 24, a k-order exponential Golomb (EGk) decoding module 25 and a selection module 26. In practice, the decoder 110 may be utilized to perform the abovementioned decoding process 700 in FIG. 7 or the decoding process 800 in FIG. 8, with associated details to be described below.

When the decoder 110 is utilized to perform the decoding process 800, the reception module 21 receives an input bitstream. Each time the bit zero detection module 22 receives a bit "0" or a bit "1" last received from the reception module 21, the counter module 23 correspondingly updates the bit count. When the bit last received is "0" and the bit count is smaller than a first threshold, the unary decoding module 24 generates an index according to the bit count, and outputs the index through the selection module 25. When the bit last received is "0" and the bit count is greater than the first threshold, the EGk decoding module 25 performs a look-up operation according to the bit count to generate a first value, and determines a remaining bit count M according to the bit count and a second threshold. After the EGk decoding module 25 generates a second value according to an M number of remaining bits received from the input bitstream, the first value and the second value are added to generate the index, which is then output via the selection module 25. The selection module 26 determines whether to output the index via the unary decoding module 24 or the EGk decoding module 25 according to the bit count. It can be easily appreciated by a person having ordinary skill in the art that, details of the decoding process 700 in the abovementioned can be applied to the decoder 110 and shall be omitted herein for the sake of brevity.

On the other hand, when the decoder 110 is utilized to perform the decoding process 800, the reception module 21 receives an input bitstream. Each time the bit zero detection module 22 receives an N bits from the input bitstream, the bit zero detection unit 22 detects whether the N bits last received are "0" or "1", where N is an integer greater than 1. When the N number of bits comprise "0" and the first bit "0" appearing in the N bits is the $i^{th}$ bit, the counter module 23 increments a value of the bit count by i, where i is an integral index between 1 and N. When all of the N bits are "1", the counter module 23 adds the value of the bit count by N. When the bit count is smaller than or equal to a first threshold, the unary decoding module 24 generates an index according to the bit count, and outputs the index via the selection module 26. When the bit count is greater than the first threshold, the EGk decoding module 25 generates a first value according to the N bits and the bit count, and determines a remaining bit count M according to the N bits, the bit count and a second value. After the EGk decoding module 25 generates a second value according to an M number of remaining bits received from the input bitstream, the first value and the second value are added to generate the index, which is then output via the selection module 25. The selection module 26 determines whether to output the index via the unary decoding module 24 or the EGk decoding module 25 according to the bit count. It can be easily appreciated by a person having ordinary skill in the art that, details of the decoding process 800 in the abovementioned can be applied to the decoder 110 and shall be omitted herein for the sake of brevity.

Figure 12:
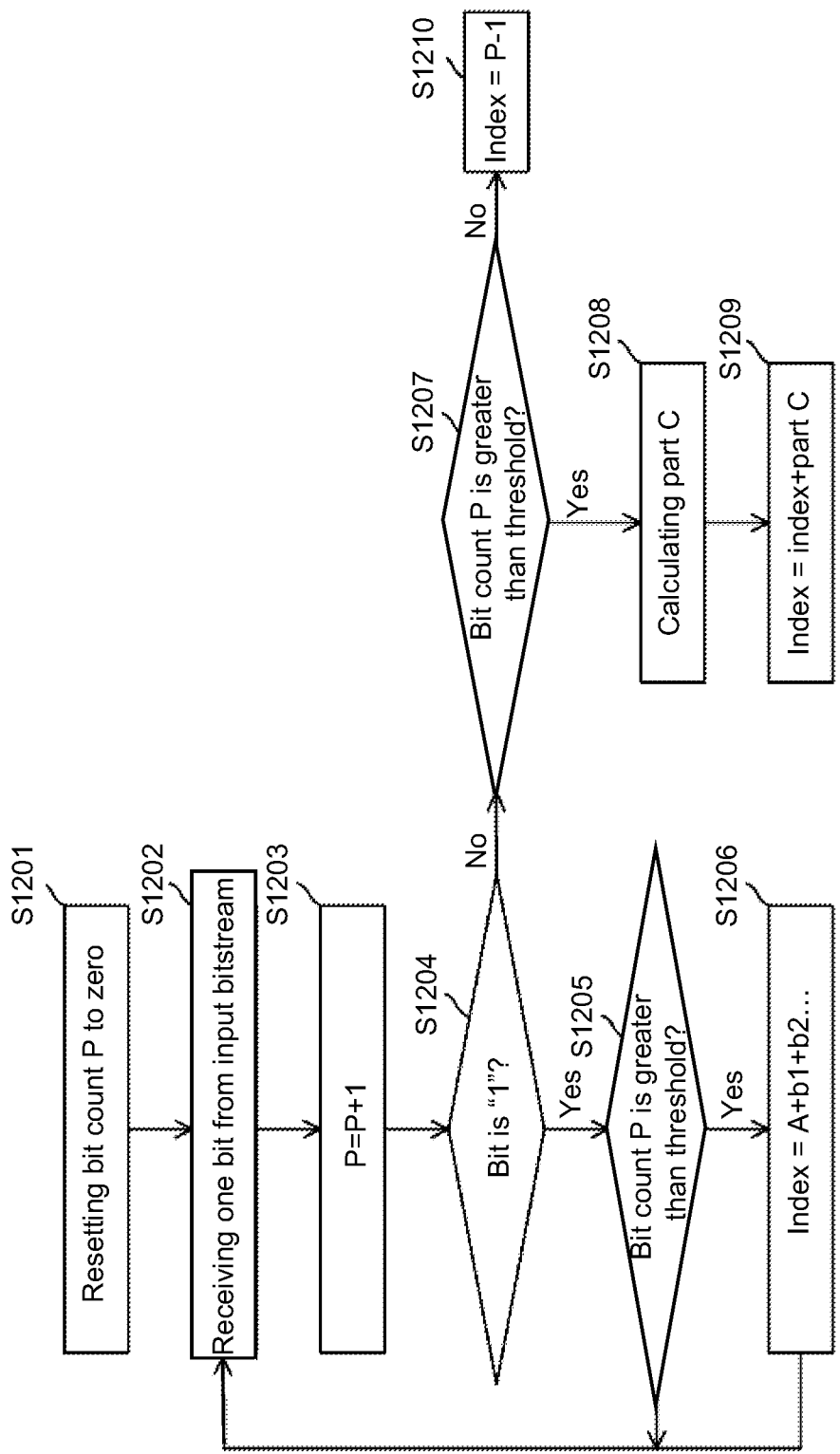
FIG. 12 is a flowchart of a decoding method according to yet another embodiment of the present invention.

According to an alternative embodiment of the present invention, a decoding process is provided, as shown by a flowchart in FIG. 12. Each time a new index is to be identified, the method comprises the following steps. In step S1201, a bit count P is reset, e.g., to zero. In step S1202, one bit is received from an input bitstream. In step S1203, the bit count P is incremented by 1. In step S1204, it is determined whether the bit last received is "1". Step S1207 is performed when a determination result of step S1204 is no to determine whether the current bit count P is greater than a threshold. When a determination result of step S1207 is no, it means that the UEGk code comprises only the part A, and so the index is set to equal (P−1) in step S1210. Conversely, step S1205 is performed when the determination result of step S1204 is yes to determine whether the current bit count P is greater than the threshold. Steps S1202 to S1204 are again performed when a determination result of step S1205 is no, or else step S1206 is performed when the determination result of step S1205 is yes. In step S1206, the index corresponding to the part A and the part B is calculated according to the received bits, with details thereof to be described shortly. As shown in FIG. 12, when the determination result of step S1205 is yes, it means that the UEGk code comprises the parts A, B, and C. In step S1208, the part C is calculated according to the threshold and the bit count. In step S1209, the index is added by the part C into a new index. In the above embodiment, an example of receiving one bit each time from the input bitstream is described. In another embodiment, N bits may also be received each time from the input bitstream, where N is a positive integer. A person having ordinary skill in the art should be able to easily adjust corresponding steps to complete the decoding process of the UEGk code.

In practice, the threshold is a maximum length of the part A of the UEGk code. A situation of assuming that the threshold is equal to 4, and the part B and part C have an equal length is utilized for explaining the above decoding process. When the input bitstream is {1 1 0 1 1 . . . }, steps S1202 to S1205 are repeatedly preformed for three times, until step S1204 is performed for the fourth time and the determination result of step S1204 is no. Next, since the current bit count P is equal to 4, which is not greater than the threshold of 4, the determination result of step S1207 is no, and so step S1210 is performed to calculate that the index is equal to 3.

When the input bitstream is {1 1 1 1 1 1 0 0 1 1 . . . } the determination result of step S1205 performed for the fifth time is yes. As such, it is determined that five bits in a value "1" are consecutively received according to the bit count in a value of 5. Further, according to the known threshold, it is determined, among the currently received five bits, the first four bits correspond to the part A of the UEGk code to be decoded, and the fifth bit corresponds to the part B of the UEGk code to be decoded. Thus, in step S1206 performed for the first time, an index equal to 6 ($=4+2^1$) is calculated, where the value of 4 in the equation is contributed by the four bits of the part A, and the value of $2^1$ is contributed by the first bit "1" in the part B. Steps S1202 to S1206 are again performed. In step S1206 performed this time, a new index equal to 10 ($=6+2^2$) is calculated, where $2^2$ in the equation is contributed by the bit "1" last received (i.e., the second bit "1" of the part B). The determination result of step S1204 is no as the seventh bit of the input bitstream is "0", and the determination result of step S1207 is yes as the current bit count is equal to 7. According to the current bit count equal to 7, a threshold of 4 is subtracted from the bit count of 7 to obtain that the length of the part B is equal to 3 to further obtain that the length of the part C is also 3. Hence, the part C is the three bits "001" subsequent to the seventh bit of the input bitstream. In step S1208, a value of the part C is calculated as equal to 1. In step S1209, a final index is calculated to be equal to 11 (=10+1).

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A decoding method for a unary/$k^{th}$ order exponential Golomb (UEGk) code, comprising:
   a) receiving an N number of bits from an input bitstream, and updating a bit count according to N, wherein N is a positive integer;
   b) repeating step (a) when all of the N number of bits are "1";
   c) generating a first value through a look-up table search at least according to the bit count when not all of the N number of bits are "1";
   d) determining a remaining bit count M according to the bit count and a threshold;
   e) generating a second value according to an M number of remaining bits received from the input bitstream; and
   f) adding the first value and the second value to generate an index.

2. The decoding method according to claim 1, wherein the positive N is equal to 1.

3. The decoding method according to claim 1, wherein the positive integer is greater than 1;
   wherein generating the first value through the look-up table search is done according to the N number of bits and the bit count when not all of the N number of bits are "1";
   wherein determining the remaining bit count M is done according to the N number of bits, the bit count and the threshold.

4. The decoding method according to claim 3, wherein the look-up table search further comprises:
   selecting a target look-up table from the N number of look-up tables according to the N number of bits, wherein the N number of look-up tables are provided in advance; and
   searching through the target look-up table according to the bit count to generate the first value.

5. The decoding method according to claim 1, wherein the positive integer is equal to 1;
   wherein, prior to receiving the N number of bits from the input bitstream, the method further comprising:
   g) receiving one bit from the input bitstream, and updating the bit count;
   h) determining whether the bit count is greater than a second threshold; and
   i) performing steps a) to f) when a determination result of whether the bit count is greater than a second threshold is yes.

6. The decoding method according to claim 1, wherein the positive integer is greater than 1; before step a), the method further comprising:
   g) receiving an N number of bits from the input bitstream, and updating the bit count;
   h) determining whether all of the N number of bits are "1";
   i) updating the bit count and determining whether the bit count is greater than a third threshold when a determination result of determining whether all of the N number of bits are "1" is yes;
   j) repeating steps g) and h) when a determination result of determining whether the bit count is greater than a third threshold is no; and
   k) setting the bit count as the another bit count and performing steps a) to f) when the determination result of determining whether the bit count is greater than a third threshold is yes.

7. A decoder for a unary/$k^{th}$ order exponential Golomb (UEGk) code, comprising:
   a reception module, for receiving an input bitstream, and outputting an N number of bits each time, wherein N is a positive integer;
   a counter module, for recording a bit count, and updating the bit count according to the N number of bits when the reception module outputs the N number of bits each time;
   a bit zero detection module, for detecting whether the N number of bits last output by the reception module are "0" or "1";
   a memory unit, storing a look-up table;
   a look-up table search module, for searching through the look-up table at least according to the bit count when the bit zero detection module determines that not all of the N number of bits last output by the reception module are "1" to generate a first value;
   a remaining bit determination module, for determining a remaining bit count M at least according to the bit count and a threshold, and generating a second value according to an M number of remaining bits received from the input bitstream; and a calculation module, for adding the first value and the second value to generate an index.

8. The decoder according to claim 7, wherein the positive N is equal to 1.

9. The decoder according to claim 7, wherein the positive integer is greater than 1;
wherein the look-up table search module looks up the look-up table according to the N number of bits and the bit count and generates the first value when not all of the N number of bits are "1";
wherein the remaining bit determination module determines the remaining bit count M according to the N number of bits, the bit count, and the threshold.

10. The decoder according to claim 9, wherein the memory module stores an N number of look-up tables;
wherein the look-up table search module selects a target look-up table from the N number of look-up tables according to the N number of bits, and searches the target look-up table according to the bit count to generate the first value.

11. The decoder according to claim 7, wherein the look-up table search module, the remaining bit determination module, and the calculation module starts operating when the bit count is greater than a second threshold;
wherein the decoder further comprises:
a unary bit decoding module, for generating the index when the bit count is smaller than or equal to the second threshold.

12. A decoding method for a unary/$k^{th}$ order exponential Golomb (UEGk) code, comprising:
a) receiving an N number of bits from an input bitstream;
b) determining whether all of the N number of bits received in step a) are "1", and updating a bit count according to the N number of bits;
c) determining whether the bit count is greater than a threshold when a determination result of step b) is yes;
d) repeating steps a) and b) when the determination result of step c) is no;
e) updating an index according to the bit count when a determination result of step c) is yes, and repeating steps a) and b);
f) determining whether the bit count is greater than the threshold when the determination result of step b) is no;
g) calculating a final index according to the bit count when a determination result of step f) is no;
h) calculating a remaining value according to the threshold and the bit count when the determination result of step f) is yes; and
i) adding the index and the remaining value to generate the final index.

\* \* \* \* \*